(12) United States Patent
Chefd'hotel et al.

(10) Patent No.: US 8,553,964 B2
(45) Date of Patent: Oct. 8, 2013

(54) UNIFYING RECONSTRUCTION AND MOTION ESTIMATION IN FIRST PASS CARDIAC PERFUSION IMAGING

(75) Inventors: Christophe Chefd'hotel, Jersey City, NJ (US); Mathews Jacob, Rochester, NY (US); Sajan Goud Lingala, Rochester, NY (US); Mariappan S. Nadar, Plainsboro, NJ (US); Li Zhang, Skillman, NJ (US)

(73) Assignee: Siemens Aktiengesellschaft, Munich (DE)

( * ) Notice: Subject to any disclaimer, the term of this patent is extended or adjusted under 35 U.S.C. 154(b) by 97 days.

(21) Appl. No.: 13/273,410

(22) Filed: Oct. 14, 2011

(65) Prior Publication Data
US 2012/0148128 A1 Jun. 14, 2012

Related U.S. Application Data

(60) Provisional application No. 61/394,861, filed on Oct. 20, 2010.

(51) Int. Cl.
*G06K 9/00* (2006.01)
*A61B 5/00* (2006.01)
*A61B 8/00* (2006.01)

(52) U.S. Cl.
USPC .................. 382/131; 600/363; 600/450

(58) Field of Classification Search
USPC ............. 382/128–134, 103, 107, 190, 236; 378/4, 8, 21–27, 101, 46, 62, 90, 901; 600/407, 600/410, 425, 427, 363, 450, 479, 481; 128/920, 922; 348/154, 155, 169
See application file for complete search history.

(56) References Cited

U.S. PATENT DOCUMENTS 7,817,838 B2 * 10/2010 DiBella et al. ............... 382/131
8,111,893 B2 * 2/2012 Chen et al. .................. 382/131

* cited by examiner

*Primary Examiner* — Abolfazl Tabatabai
(74) *Attorney, Agent, or Firm* — Donald P. Paschburg

(57) ABSTRACT

Methods and a system to unify reconstruction and motion estimation steps in first pass cardiac perfusion MRI include a global objective function that meets data consistency, spatial smoothness, motion and contrast dynamics constraints. The global objective decomposed into simpler sub-problems which include low pass filtering of a deformed object, TV shrinkage, analytical Fourier replacement and an $l_2$ minimizing problem. A registration tool based on the local cross-correlation similarity measure and enabled to perform both rigid and flexile deformations, is applied. Registration parameters are tuned by rigid, semi rigid and flexible models at different stages of iterations. A system to perform the methods is also disclosed.

19 Claims, 12 Drawing Sheets

(a) Peak RV uptake (b) Transition from RV to LV (c) Peak LV uptake (d) Image time series

FIG. 9

UNIFYING RECONSTRUCTION AND MOTION ESTIMATION IN FIRST PASS CARDIAC PERFUSION IMAGING

STATEMENT OF RELATED CASES

This case claims priority to and the benefit of U.S. Provisional Patent Application Ser. No. 61/394,861, filed Oct. 20, 2010 which is incorporated herein by reference.

TECHNICAL FIELD

The present invention relates to systems and methods for cardiac imaging and more specifically to cardiac perfusion imaging.

BACKGROUND

The direct quantitative analysis of dynamic cardiac perfusion MR imaging is currently limited by motion interference with the contrast dynamics. The current practice is to perform a motion compensation step prior to perfusion quantification. Most of the motion compensation algorithms require that the data is reconstructed with minimal artifacts. Many k-t reconstruction schemes perform poorly in the presence of motion to yield motion artifacts.

Designing a framework that unifies the steps of reconstruction and motion estimation would be mutually beneficial.

Accordingly, novel and improved systems and methods for first pass cardiac perfusion that apply a unifying approach of motion estimation and dynamic image reconstruction in the context of first pass perfusion imaging are required.

SUMMARY OF THE INVENTION

Systems and methods for first pass cardiac perfusion are provided which apply a unifying approach of motion estimation and dynamic image reconstruction in the context of first pass perfusion imaging.

In accordance with an aspect of the present invention a global objective function is provided that meets data consistency, motion and contrast dynamics constraints is minimized.

In accordance with an aspect of the present invention a novel variable splitting framework to simplify the objective function into multiple simpler sub problems is provided that can be solved efficiently. The sub problems are solved in an iterative manner using efficient continuation strategies. Results on the frame work formulation and demonstrations using the Physiologically improved Non uniform CArdiac Torso (PINCAT) phantom data are provided to evaluate the utility of the developed scheme.

In accordance with an aspect of the present invention, a method is provided for processing perfusion images to correct motion effects, comprising a processor receiving undersampled image data of a dynamic scene of a first-pass cardiac perfusion MRI, the processor minimizing a single objective function that combines at least three terms, each term depending on image data representing a true dynamic scene, wherein a first term expresses a motion estimation related to the undersampled image data, a second term expresses a temporal constraint and a third term expresses a spatial constraint and the processor generating data representing a reconstructed perfusion image corrected for motion based on the minimized single objective function.

In accordance with a further aspect of the present invention a method is provided, wherein the objective function is expressed as $|Af-b|_2^2+\lambda|(Df)_t|_2^2+\mu|Tf|$, wherein f is a vector representing the true dynamic scene related to the undersampled image data, A is an operator specifying an undersampling Fourier task, b is a vector representing the undersampled image data. D is a deformation operator, T is a spatial total variation operator, $(.)_t$ is a first order temporal derivative operator, $\lambda$ a regularization factor, and $\mu$ is a tuning parameter.

In accordance with yet a further aspect of the present invention a method is provided, further comprising the processor minimizing the objective function by constraining the temporal constraint term and the spatial constraint term and applying a penalizing term that penalizes a violation of the constraining.

In accordance with yet a further aspect of the present invention a method is provided, wherein the constrained objective function is expressed as:

$$|Af-b|_2^2 + \lambda|g_t|_2^2 + \frac{\beta_1}{2}|Df-g|_2^2 + \mu|w| + \frac{\beta_2}{2}|Tf-w|_2^2,$$

with Df=g and Tf=w, wherein: f is a vector representing the true dynamic scene related to the undersampled image data, A is an operator specifying an undersampling Fourier task, b is a vector representing the undersampled image data D is a deformation operator, T is a spatial total variation operator, $(.)_t$ is a first order temporal derivative operator, $\lambda$ a regularization factor, $\mu$ is a tuning parameter, g and w are auxiliary variables, and $\beta_1$ and $\beta_2$ are penalty parameters.

In accordance with yet a further aspect of the present invention a method is provided, wherein the constrained objective function is minimized by the processor for the four variables f, D, g and w.

In accordance with yet a further aspect of the present invention a method is provided, wherein the constrained objective function is minimized iteratively by alternately solving one of the four variables while keeping three other variables fixed.

In accordance with yet a further aspect of the present invention a method is provided, wherein f, D and w are fixed and g is solved in a temporal Fourier domain by a numerical implementation of a low-pass filter.

In accordance with yet a further aspect of the present invention a method is provided, wherein w is solved by applying a shrinkage operator.

In accordance with yet a further aspect of the present invention a method is provided, wherein f is solved analytically in a Fourier domain.

In accordance with yet a further aspect of the present invention a method is provided, further comprising solving the four variables for a first value of $\beta_1$ and $\beta_2$ until a stopping criterion is met, incrementing and $\beta_1$ and $\beta_2$ to a second value and solving the four variables for the second value of $\beta_1$ and $\beta_2$.

In accordance with yet a further aspect of the present invention a method is provided, wherein $\beta_1$ and $\beta_2$ are increased in value followed by solving the four variables until the constraints Df=g and Tf=w are met.

In accordance with yet a further aspect of the present invention a method is provided, wherein the reconstructed perfusion image corrected for motion based on the minimized single objective function is determined by Df.

In accordance with another aspect of the present invention a system is provided to process perfusion images to correct motion effects, comprising a memory, enabled to store data, a processor, enabled to execute instructions to perform the steps receiving undersampled image data of a dynamic scene of a first-pass cardiac perfusion MRI, minimizing a single objective function that combines at least three terms, each term depending on image data representing a true dynamic scene, wherein a first term expresses a motion estimation related to the undersampled image data, a second term expresses a temporal constraint and a third term expresses a spatial constraint and generating data representing a reconstructed perfusion image corrected for motion based on the minimized single objective function.

In accordance with yet another aspect of the present invention a system is provided, wherein the objective function is expressed as $|Af-b|_2^2+\lambda|(Df)_t\oplus_2^2+\mu|Tf|$, wherein f is a vector representing the true dynamic scene related to the undersampled image data, A is an operator specifying an undersampling Fourier task, b is a vector representing the undersampled image data, D is a deformation operator, T is a spatial total variation operator, $(.)_t$ is a first order temporal derivative operator, $\lambda$ a regularization factor, and $\mu$ is a tuning parameter.

In accordance with yet another aspect of the present invention a system is provided, the processor further performing the steps minimizing the objective function by constraining the temporal constraint term and the spatial constraint term and applying a penalizing term that penalizes a violation of the constraining.

In accordance with yet another aspect of the present invention a system is provided, wherein the constrained objective function is expressed as $$|Af - b|_2^2 + \lambda|g_t|_2^2 + \frac{\beta_1}{2}|Df - g|_2^2 + \mu|w| + \frac{\beta_2}{2}|Tf - w|_2^2,$$

with Df=g and Tf=w, wherein f is a vector representing the true dynamic scene related to the undersampled image data, A is an operator specifying an undersampling Fourier task, b is a vector representing the undersampled image data, D is a deformation operator, T is a spatial total variation operator, $(.)_t$ is a first order temporal derivative operator, $\lambda$ a regularization factor, $\mu$ is a tuning parameter, g and w are auxiliary variables, and $\beta_1$ and $\beta_2$ are penalty parameters.

In accordance with yet another aspect of the present invention a system is provided, wherein the constrained objective function is minimized by the processor for the four variables f, D, g and w.

In accordance with yet another aspect of the present invention a system is provided, wherein the constrained objective function is minimized iteratively by alternately solving one of the four variables while keeping three other variables fixed.

In accordance with yet another aspect of the present invention a system is provided, wherein f, D and w are fixed and g is solved in a temporal Fourier domain by a numerical implementation of a low-pass filter.

In accordance with yet another aspect of the present invention a system is provided, wherein w is solved by applying a shrinkage operator.

DESCRIPTION OF THE DRAWINGS

FIG. 9 illustrates evolving reconstructions in accordance with an aspect of the present invention;

DESCRIPTION

Figure 1:
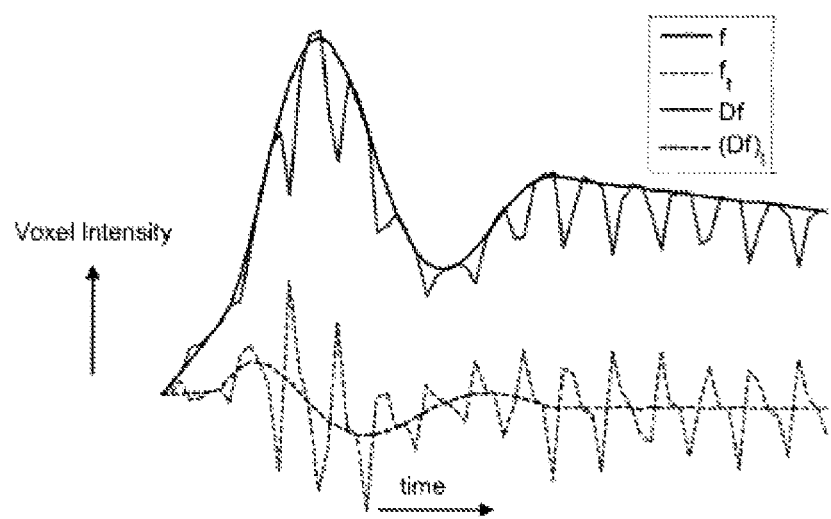
FIG. 1 illustrates the use of a temporal derivative on the deformed dynamic scene.

In the recent past, dynamic contrast enhanced (DCE) cardiac MRI has been gaining popularity due to its potential to inspect coronary artery related diseases (CAD). The so called ischemic cascade starts by continuous perfusion defects which may cause necrosis which in turn reduces the myocardial function and eventually leads to heart failure. The defects at the early stages of ischemic events are local to the blood supply regions which if detected could have the capability to identify areas of the heart tissue that are normal but with insufficient blood supply before the cascade propagates further. This is achieved by first pass myocardial perfusion MRI examination, where tissues that are alive but at the risk of dying are identified. This examination is also performed under stress conditions using vaso-dilators as some of the perfusion defects cannot be detected during normal conditions. Scar tissues and infarcted tissues that are in the advanced stages are typically identified by late enhancement techniques. The goal of DCE cardiac MRI is to identify the clinically relevant state of the tissue for further therapy decisions.

Herein, the focus is on first pass perfusion imaging, where the dynamics of the contrast agent passage are captured by the acquisition sequence of MRI. The interference of the perfusion dynamics with any sort of motion is considered as nuisance as it could hamper the stage of perfusion quantification. Hence, the sequence is ECG/pulse gated to freeze the motion of the heart due to cardiac pumping and the patient is asked to suspend their breath during the acquisition to freeze the movement of the heart due to breathing. Typical breath holds to obtain clinically acceptable image quality range from 35-50 seconds, which could be demanding for critically ill patients and could get even more stringent during stress examinations. Many patients typically fail to meet the long breath hold demands which results in residual motion that have to be corrected prior to the quantification step.

A registration step has to be used for correcting the motion in first pass perfusion images. The major challenge for any registration scheme is to deal with the contrast variations across the image sequence. Clearly a similarity measure just based on voxel differences would be sub optimal. Many approaches have been proposed in this context and an overview of most of these schemes is presented in the article [1] J. Milles, R J. van der Geest, M. Jerosch-Herold, J. H. C. Reiber, and B. P. F. Lelieveldt, "Fully automated motion correction in first-pass myocardial perfusion MR image sequences," *IEEE Transactions on Medical Imaging*, vol 0.27, no. 11, pp. 1611-1621, 2008.

Specifically, these approaches are classified into implicit and explicit methods depending on the manner in which the contrast variations are dealt with. In the implicit approaches, the variations are dealt within the similarity measure itself. Here the reference mage is chosen from the image sequence itself. For example, a similarity measure that measures the nonlinear intensity change between the reference and floating image would fall in the implicit category.

The explicit class of methods has a reference image series that is time varying, which takes into account the contrast dynamics. Approaches based on mutual information and certain land marks or contours have been shown to be a good proposition. The draw back here still remains the long computational processing time (mutual information based methods) and sometimes the manual tedious process to extract the features or landmarks. Several researchers have used rigid and flexible models in different ways depending on the degree and nature of the motion present in the data as described in "[2] R Bansal and G. Funka-Lea, "Integrated image registration for cardiac MR perfusion data," in *Proc. MICCAI*, 2002, pp. 659-666" and in "[3] G. Z. Yang, P. Burger, J. Panting, P. D. Gatehouse, D. Rueckert, D. J. Pennell, and D. N. Firmin, "Motion and deformation tracking for shortaxis echo-planar myocardial perfusion imaging," *Med. Image Anal.*, vol. 2, pp. 285-302, 1998." For example Yang et. al in "[3] G. Z. Yang, P. Burger, J. Panting, P. D. Gatehouse, D. Rueckert, D. J. Pennell, and D. N. Firmin, "Motion and deformation tracking for shortaxis echo-planar myocardial perfusion imaging," *Med. Image Anal.*, vol. 2, pp. 285-302, 1998" uses a rigid model to initially correct for translational motion based on a phase difference metric and later uses a more deformable model to correct the shape changes.

Certain classes of schemes are target based as described in "[4] G. Adluru, E. V. R DiBella, and M. R Schabel, "Model-based registration for dynamic cardiac perfusion MRI," *Magn. Reson. Med.*, vol. 0.24, pp. 1062-1070, 2006" where a simple distance measure would suffice since one has multiple reference images along time and can perform individual frame-frame registration.

A common aspect between all the above registration methods is that they require the data to be reconstructed almost perfectly with minimal artifacts. Any inaccuracies in the reconstruction step could be propagated to the registration stage. For example, reconstruction techniques such as k-t BLAST as described in "[5] J. Tsao, P. Boesiger, and K. Pruessmann, "kt BLAST and kt SENSE: dynamic MRI with high frame rate exploiting spatiotemporal correlations," Magnetic Resonance in Medicine, vol. 50, no. 5, pp. 1031-1042, 2003" and kt FOCUSS such as described in "[6] H. Jung, J. Park, J. Yoo, and J. C. Ye, "Radial k-t FOCUSS for high-resolution cardiac cine MRI," Magnetic Resonance in Medicine, October 2009" perform poorly in the presence of breathing motion, which results in motion artifacts and this can reduce the performance of the registration step.

One aspect of the present invention is to unify the reconstruction and motion estimation steps into a single framework that uses only the under-sampled data and produces motion free perfusion DCE images. The advantage of using such an approach can be beneficial for both the reconstruction and registration steps. Many model based reconstruction schemes perform significantly better with the motion compensated and obtaining images that have minimal motion artifacts are highly desirable for the registration algorithm to work precisely. There have been few recent proposed methods based on different flavors to obtain a unified reconstruction-motion estimation strategy.

Jeffrey A Fessler in "Optimization Transfer Approach to Joint Registration Reconstruction for Motion compensated Image reconstruction", in the proceedings of ISBI 2010, proposes to use a majorize maximize transfer approach to simplify the main optimization problem. Essentially his scheme alternates between minimization steps of a reconstruction model and a registration problem. Each problem is solved in an iterative manner assuming the other problem is fixed. The motion model used in this work assumes that any image in the time series is the warped version of a base image. This assumption would not be met with most of the similarity metrics for contrast based applications. One would have to use the more computational demanding mutual information, land mark based approaches in the registration step of this scheme, which could be a drawback from the performance speed of the frame work. Jung et. al in "[8] H. Jung, and J. C. Ye, "Motion Estimated and Compensated Compressed Sensing Dynamic Magnetic Resonance Imaging: What We Can Learn From Video Compression Techniques, "*International Journal of Imaging Systems and Technology*, vol 20, pp. 81-98, 18 May 2010" proposed to use motion estimation and motion compensation in their reconstruction k-t FOCUSS on cardiac cine and fmri data. They have fully sampled images as their reference data and register the intermediate under-sampled frames with the reference images and repeat this in an iterative manner. This approach again lacks flexibility when dealing with data that has contrast dynamics and similar argument of using complex similarity measures hold.

The first attempt to the unifying frame work in the context of cardiac perfusion MRI was made by H. Pederson et. al in "[9] Pedersen, H., Olafsdottir, H., Larsen, R, and Larsson, A unifying model of perfusion and motion applied to reconstruction of sparsely sampled free-breathing myocardial perfusion MRI. In *Proceedings of the* 2010 *IEEE international Conference on Biomedical Imaging: From Nano To Macro* (Rotterdam, Netherlands, Apr. 14-17, 2010)" and in "[10] H. Pedersen and H. B. W. Larsson and R Larsen, "Reconstruction of free-breathing myocardial perfusion MRI using simultaneous modeling of perfusion and motion (SMPM) and arbitrary k-space sampling", in proceedings of ISMRM 2009." Pedersen et al. use a non linear two compartment model to model the perfusion dynamics. It applies an extremely simplified parameterized motion model, where the unknown in the motion estimation problem is to determine a single parameter. Specifically, this model has a reference motion template which was obtained by registering fully sampled images at the end of expiration and end-inspiration and the depth of respiration motion at any frame was controlled by a scale parameter that is estimated in the provided framework. That framework does not couple the model parameters (motion and perfusion) to the under-sampled k-t space data and there are at least two cost functions to be minimized.

Herein, as an aspect of the present invention a framework is provided that has the reconstruction with appropriate spatial constraints, motion estimation, inherent perfusion dynamic constraints all in a single unified cost function. Also provided in accordance with an aspect of the present invention is an elegant variable splitting framework with continuation to solve a formulated cost function. This motion estimation approach is drastically different from that of the above mentioned J. Fessler and Pederson et. al approaches. The herein provided approach has a reference image time series that is smooth and contains only the perfusion dynamics.

In the next sections, the framework that is an aspect of the present invention and results and findings on the PINCAT data are presented.

Formulating the Objective Function

In accordance with an aspect of the present invention an objective function is formulated as:

$$\min_{f,D} |Af-b|_2^2 + \lambda|(Df)_t|_2^2 \qquad (1)$$

The under-sampled k-t space data is stored in the vector b, while the true dynamic scene (which has perfusion and motion) is denoted by the vector f. The under-sampling Fourier operator is denoted by A and D is a deformation operator. Here, $|Af-b|_2^2$ is the fidelity term to the acquired sparse data, b. The second term has a constraint on the smoothness of the deformed object. It is posed as a minimum energy constraint (or the minimum $L_2$ norm) on the first order temporal derivate of the deformed object. Here $(.)_t$ is the first order temporal derivative operator and $\lambda$ is the weight of the regularizer. $|.|_2$ indicates the $L_2$ norm.

The schematic provided in FIG. 1 demonstrates the motivation of using the temporal derivative to accomplish the smoothness constraint. The temporal derivative of the deformed object has minimum energy: If the motion is compensated/corrected in f, the deformed dynamic scene (Df) would have only the slow dynamics due to perfusion and is usually smooth. Since the derivative captures the changes in directions in the time series, which are significantly reduced by the motion compensation step, the energy of the temporal derivative would be significantly less here when compared to the one in which motion is present.

Introducing a Spatial Constraint

A sparse model is introduced to allow for operations with under-sampled data. The motivation here is to exploit the redundancy in the dynamic data by sparsifying the signal in certain predetermined domains; which would allow for efficient recovery of the underlying dynamic scene from sparse measurements. A spatial Total Variation (TV) constraint is used to exploit the sparsity of the gradient in the horizontal and vertical directions. The TV constraint is used since it has proven to be very powerful in various image recovery applications and is shown to provide comparable or better performance than most other transform domain schemes. With the TV constraint, the objective function is:

$$\min_{f,D} \underbrace{|Af-b|_2^2}_{\text{data consistency}} + \underbrace{\lambda|(Df)_t|_2^2}_{\text{temporal constraint}} + \underbrace{\mu[Tf]}_{\text{spatial constraint}} \qquad (2)$$

where T is the TV operator given by $\sqrt{|T_x f|^2+|T_y f|^2}$, and $T_x$, $T_y$ are the finite differences of f in the horizontal and vertical directions respectively.

The amount of the spatial regularization can be controlled by the tuning parameter, $\mu$. In the experiments, $\mu$ is carefully tuned such that only the spatial streaking artifacts from under-sampling are reduced, while preserving important details such as the spatial edges by not penalizing the gradients excessively.

An Optimization Method

The following difficulties arise in trying to solve the formulated cost in (2) directly: (a) No explicit reference image time series is available to estimate D; (b) The third term in (2) which involves the $l_1$ norm is non-differentiable. In order to address these two issues, the unconstrained problem in (2) is first converted to a constrained one in (3) by introducing auxiliary variables g and W:

$$\min_{f,D,g,W} |Af-b|_2^2 + \lambda|g_t|_2^2 + \mu|W| \qquad (3)$$

such that $Df=g$ and $Tf=w$

Next, the equality constraints are relaxed and their violations are penalized by quadratic functions as:

$$\min_{f,D,g,W} |Af-b|_2^2 + \lambda|g_t|_2^2 + \frac{\beta_1}{2}|Df-g|_2^2 + \mu|W| + \frac{\beta_2}{2}|Tf-w|_2^2 \qquad (4)$$

When the penalty parameters $\beta_1$ and $\beta_2$ approach $\infty$, the solution of (4) tends to that of (3). The cost in (4) has to be now minimized with four variables f, D, g, w. Although, this appears complicated at first look, its easier to solve for these decision variables in an alternating manner by solving a variable of interest assuming the rest to be known. One would have simpler sub problems that can be solved in parallel since the auxiliary variables are separated in (4). This inherently also simplifies the formulation of the motion estimation (D) sub problem, where one would be minimizing $|Df-g|_2^2$ for a fixed f, g and w with regard to D. This takes a form which can be dealt by a standard image registration tool. In the next section, the forms taken by individual sub problems and their solutions will be provided and discussed.

(a) g sub problem (Fix f, D, w):

$$\min_g \frac{\beta_1}{2}|Df-g|_2^2 + \lambda|g_t|_2^2 \qquad (5)$$

This is a quadratic smoothing problem, which can be solved exactly as follows: (5) involves minimizing the cost with regard to g, which is also a function of time t, i.e. one has to solve a functional (function of function). To achieve this, the method of calculus of variations as for instance described in "[11] Chapter 19 in Richard Phillips Feynman, Robert B Leighton, Matthew Sands," Feynman's lectures on Physics (Volume 2)", Pearson Publishers" and "[12] Lecture notes of B. Russak, "CALCULUS OF VARIATIONS MA 4311 LECTURE NOTES" URLhttp://www.math.nps.navy.mill-bneta14311.pdf" is used.

To explicitly highlight the variables in this functional, (5) is rewritten by loosely substituting g and $g_t$ by $x_1$ and $x_2$ respectively. The cost would now be $$C(X) = \frac{\beta_1}{2}|(Df-x_1)|_2^2 + \lambda|x_2|_2^2 \qquad (6)$$

where $X=(x_1, x_2)$ and the task is to find a minimizing solution $X^*$ such that $C(X^*) \leq C(X)$ for all points X in the search domain.

Now, considering a small perturbation/variation $\epsilon$ in a direction H from $X^*$, we get the points $X(\epsilon)=X^*+\epsilon H$, which would satisfy the condition: $C(X^*+\epsilon H)-C(X) \geq 0$ for $-\delta < \epsilon < \delta$; $\delta$ being a small number. The necessary condition for optimality is obtained by the Euler equation, $\nabla_x C=0$.

Since C is a functional with the components of $X(\epsilon)$ specified by $x_1(\epsilon)=x^*_1+\epsilon h_1$ and $x_2(\epsilon)=x^*_2+\epsilon h_2$, one has to apply the differentiation by the chain rule to get:

$$\left\langle \frac{\partial C}{\partial x_1}, \frac{\partial x_1}{\partial \varepsilon} \right\rangle + \left\langle \frac{\partial C}{\partial x_2}, \frac{\partial x_2}{\partial \varepsilon} \right\rangle = 0 \qquad (7)$$

where $\langle , \rangle$ is the inner product operator.

Solving (7), one gets $$\frac{\beta_1}{2}\langle x_1 - Df, h_1 \rangle + \langle x_2, h_2 \rangle = 0$$

Now substituting back g and $g_t$ for $x_1$ and $x_2$, $$\frac{\beta_1}{2\lambda}\langle g - Df, h \rangle + \langle g_t, h_t \rangle = 0 \quad (8)$$

Simplifying the second inner product (which is an integration) by using the integration by parts rule, one gets:

$$\frac{\beta_1}{2\lambda}\langle g - Df, h \rangle + \langle h, g_{tt} \rangle = 0 \quad (9)$$

i.e, $$\left\langle g - Df - \frac{2\lambda}{\beta_1}g_{tt}, h \right\rangle = 0 \quad (10)$$

This is true for all h only when $$g - Df - \frac{2\lambda}{\beta_1}g_{tt} = 0 \quad (11)$$

This is a differential equation in g, which can be solved in the Fourier domain efficiently:

$$F(g) = \frac{F(Df)}{\left(1 + \frac{2\lambda}{\beta_1}\omega^2\right)} \quad (12)$$

where ω is the temporal frequency and F is a temporal Fourier operator.

The above equation is a numerical implementation of a low pass filter. The solution in g is a low pass filtered version of the deformed object Df. For a fixed λ, low value of $\beta_1$ would have a stringent cut off passing only components of extremely low frequency, while increasing $\beta_1$, would allow the higher frequencies to pass as well. It is this behavior of the filter that is capitalized by the registration block next to provide robust and efficient motion compensation.

(b) w sub problem (Fix g, D, f).

$$\min_w \frac{\beta_2}{2}|Tf - w|_2^2 + \mu|w| \quad (13)$$

To solve this, the multi-dimensional shrinkage solution derived by J Yang et. al as described in "[13] J. Yang, W. Yin, Y. Zhang, and Y. Wang, *A fast algorithm for edge-preserving variational multichannel image restoration*, Tech. Report 08-09, CAAM, Rice University. Submitted." is adapted. For the proof, one is referred to Lemma 3.3 in this reference.

$$w = \frac{f}{Tf}\left(Tf - \frac{\mu}{\beta_1}\right)_+ \quad (14)$$

Where + is the shrinkage operator given by $$(.)_+ = \begin{cases} . & \text{if } . \geq 0 \\ 0 & \text{else} \end{cases}$$

(c) f sub problem (Fix w, D, g)

$$\min_f |Af - b|_2^2 + \frac{\beta_1}{2}|Df - g|_2^2 + \frac{\beta_2}{2}|Tf - w|_2^2 \quad (15)$$

This problem is quadratic in f and can be solved analytically as follows:
Differentiating with respect to f and equating to zero $$A^T(Af - b) + \frac{\beta_1}{2}D^T(Df - g) + \frac{\beta_2}{2}T^T(Tf - w) = 0 \quad (16)$$

$$f = \left(A^TA + \frac{\beta_1}{2}D^TD + \frac{\beta_2}{2}T^TT\right)^{-1}\left(A^Tb + \frac{\beta_1}{2}D^Tg + \frac{\beta_2}{2}T^Tw\right)$$

As shown by the authors in "[14] J. Yang, Y. Zhang, and W. Yin, "A fast TVL 1-L2 minimization algorithm for signal reconstruction from partial Fourier data," IEEE J. Selected Topics in Signal Processing, vol. 4, pp. 288-297, 2009" the above problem can be efficiently solved in the Fourier domain if the Fourier operator A obtains the samples on a Cartesian grid. Ideally, while dealing with non Cartesian data, the above problem has to be solved by using a few conjugate gradient steps. In current experiments, since pseudo radial data are used (i.e. radial samples rounded to the nearest Cartesian location), the spatial Fourier domain replacement solution itself is used as given below:

$$F(f) = \frac{\left(b_{zerofill} + \frac{\beta_1}{2}F(D^Tg) + \frac{\beta_2}{2}F(T^Tw)\right)}{\left(\text{Samp}^2 + \frac{\beta_1}{2} + \frac{\beta_2}{2}(F(T_x).*F(T_x) + F(T_y).*F(T_y))\right)} \quad (17)$$

Where F is the FFT operator and Samp is the Sampling grid, which takes a value 1 if a sample is acquired on the grid and 0 otherwise.

d) D sub problem (Fix f, D, g):

$$\min_D |Df-g|_2^2 \quad (18)$$

The above is a registration problem, where the dynamic scene f, which has the perfusion and motion dynamics, has to be registered with a reference dynamic scene g that contains only perfusion and is devoid of motion. Note that the reference image time series g is the output of the first sub problem, which was a low pass filtering step. The prime assumption in the first sub problem was that the slow perfusion changes are not disturbed by the low pass filter, while the fast motion dynamics are smoothened, thereby yielding a reference series that can be used by the registration sub problem here.

A fast non rigid deformation method as described in "[15] Chefd'hotel, C., Hermosillo, G., and Faugeras, O. 2001. A variational approach to multimodal image matching. In *IEEE Workshop on Variational and Level Set Methods*, University of British Columbia, Vancouver, Canada. IEEE Computer Society, pp. 21-28", "[16] Chefd'hotel, C., Hermosillo, G., Faugeras, 0.: Flows of diffeomorphisms for multimodal image registration. In: Proc. ISBI'02. (2002) 753-756", "[17] G. Hermosillo, C. Chefd'hotel, and O. Faugeras, *Variational methods for multimodal image matching*, International Journal of Computer Vision 50 (2002), no. 3, 329-343" and "[18] Chefd'hotel Christophe, "Geometric Methods in Computer Vision and Image Processing: Contributions and Applications", *Ph.d thesis*, April 2005" is used in the present experiments. In these experiments, the registration is performed frame-frame between f and g (The first frame of f is registered to the 1st frame of g, 2nd frame of f is registered to the 2nd frame of g and so on). The highlights of the registration methods that are used as an aspect of the present invention are discussed in the next section.

The Registration Method

A non rigid intensity based deformation algorithm that maximizes the local cross-correlation between a reference and an uncorrected image is used. The method uses a Gaussian based regularizer which penalizes irregular deformations as described in "[15] Chefd'hotel, C., Hermosillo, G., and Faugeras, O. 2001. A variational approach to multimodal image matching. In *IEEE Workshop on Variational and Level Set Methods*, University of British Columbia, Vancouver, Canada. IEEE Computer Society, pp. 21-28", "[16] Chefd'hotel, C., Hermosillo, G., Faugeras, 0.: Flows of diffeomorphisms for multimodal image registration. In: Proc. ISBI'02. (2002) 753-756", "[17] G. Hermosillo, C. Chefd'hotel, and O. Faugeras, *Variational methods for multimodal image matching*, International Journal of Computer Vision 50 (2002), no. 3, 329-343" and "[18] Chefd'hotel Christophe, "Geometric Methods in Computer Vision and Image Processing: Contributions and Applications", *Ph.d thesis*, April 2005".

Specifically, it estimates the deformation such that the vector field that gives for each pixel on the reference its corresponding location on the target image is smooth. The method has the gradient of the local cross correlation as its driving force. It uses a template propagation method to estimate large deformations by the composition of small displacements. The algorithm which forms a consistent approximation of a continuous flow of diffeomorphisms, has theoretical proofs that show that the method is well posed (under mild assumptions of the regularization filter) and is guaranteed to converge to a local minimum. A multi-scale approach is used to reduce the non convex problem to multiple simpler problems that can be solved efficiently. The method's implementation was highly optimized for speed and practical usage. It had three parameters that could be controlled by the user: the size of the local neighborhood of a Gaussian window (specified by a standard deviation of $\gamma$ pixels) used to evaluate the local cross correlation, the specification of the Gaussian regularizer used to impose the smoothness constraint on the deformation field (specified by a standard deviation of a pixels), the number of scale levels ($\#_{scale}$).

Figure 2:
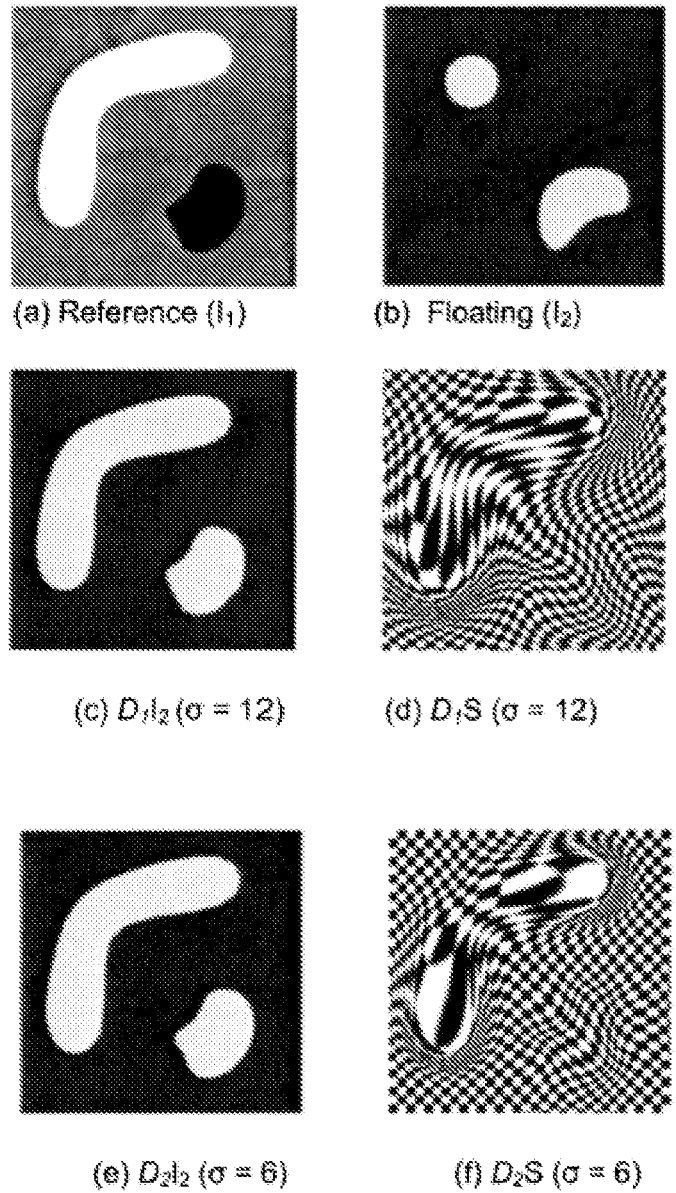
FIG. 2 illustrates the use of a Gaussian regularizer in performing flexible image registration.

FIG. 2 shows a cartoon phantom to demonstrate the role of the regularizer in performing flexible registration. FIG. 2 illustrates an example from "[18] Chefd'hotel Christophe, "Geometric Methods in Computer Vision and Image Processing: Contributions and Applications", *Ph.d thesis*, April 2005" that demonstrates the performance of the algorithm in recovering large deformations a cartoon phantom. Here the locality parameter $\gamma$ was set to 2.5 pixel neighborhood and the regularizer kernel size was ($\sigma$=12 and $\sigma$=6 pixels). As seen from the figure, the degree of the flexibility can be controlled by varying the smoothness parameter of the Gaussian regularizer. For a large $\sigma$, large chunks of pixels of the floating image are deformed together, making it a more rigid like transformation. While reducing $\sigma$, the model tends to become more flexible and would penalize the vector fields at each pixel more individually. The checker boards in this image give an idea of the degree of the underlying deformation.

FIG. 2(a) is a reference image $l_1$. FIG. 2(b) is a floating image $l_2$. FIG. 2(c) is an image $D_1l_1$ with $\sigma$=12. FIG. 2(d) is an image $D_1S$ with $\sigma$=12. FIG. 2(e) is an image $D_{212}$ with $\sigma$=6. FIG. 2(f) is an image $D_2S$ with $\sigma$=6.

For a fixed $\beta_1$ and $\beta_2$ the above four individual sub problems are solved in an alternating manner until convergence is met. Note that one requires a high value of $\beta_1$ and $\beta_2$ for the constraints in (3) to hold. At high values of $\beta_1$ and $\beta_2$, the problem becomes ill conditioned and would result in poor convergence properties. On the other hand, choosing a low value for $\beta_1$ and $\beta_2$, would ensure fast convergence but with the accuracy compromised. Recent investigators as described in "[14] J. Yang, Y. Zhang, and W. Yin, "A fast TVL 1-L2 minimization algorithm for signal reconstruction from partial Fourier data," IEEE J. of Selected Topics Signal Processing, vol. 4, pp. 288-297, 2009" and "[19] J. Yang and Y. Zhang, "Alternating direction algorithms for l1-problems in compressive sensing," preprint, 2009" proposed continuation strategies to solve this trade off in similar algorithms for total variation minimization and compressed sensing.

Some of these ideas have been borrowed to incorporate the continuation strategy to solve the problem that uses the variable splitting frame work. Specifically, the solving is started with low values of $\beta_1$ and $\beta_2$ to solve the modified cost in eq. (4). Once the stopping criterion is met, $\beta_1$ and $\beta_2$ are incremented and again eq. (4) is solved. This is repeated until the constraints in eq. (3) are satisfied. Note that in the initial stages (low values of $\beta_1$ and $\beta_2$), the convergence of the algorithm is very fast and as the continuation strategy proceeds, the rate of convergence decreases, but would approach the correct solution. This continuation strategy as shown by "[14] J. Yang, Y. Zhang, and W. Yin, "A fast TVL 1-L2 minimization algorithm for signal reconstruction from partial Fourier data," IEEE J. of Selected Topics Signal Processing, vol. 4, pp. 288-297, 2009" and "[19] J. Yang and Y. Zhang, "Alternating direction algorithms for l1-problems in compressive sensing," preprint, 2009" and observed in the experiments improves the overall convergence rate significantly while maintaining the desired accuracy levels.

The following pseudo-code summarizes the continuation strategy that is followed to solve the modified cost in eq. (4):

Initialize the Variables $n=0; \beta_1>0, \beta_2>0, f_0=0, g_0=0, w_0=0, D=I$

Repeat
  Repeat
    Update g by solving the low pass filtering problem in (12)
    Update w by using the TV shrinkage solution in (14)
    Update f in the Fourier domain by using the replacement solution in (17)
    Update D by estimating the motion using the deformation algorithm in (18)

$n=n+1$

Until stopping criterion is satisfied $\beta_1=\beta_1*(INC\_FACTOR)_1; \beta_2=\beta_2*(INC\_FACTOR)_2$ Until and A are sufficiently large for the constraints Df=g and Tf=w to hold.

Experiments and Findings

In the following section, a performance of the methods provided herein accordance with one or more aspects of the present invention is evaluated in recovering the motion and perfusion dynamics simultaneously from under-sampled k-t space data. This is believed to be a first known effort that combines non rigid registration and sparse reconstruction on cardiac perfusion MR data that uses a continuation optimization strategy.

Experiments were performed on the Physiologically Improved Non uniform CArdiac Torso (PINCAT) phantom as described in "[20] W. Segars and B. Tsui, "Study of the efficacy of respiratory gating in myocardial SPECT using the new 4-d neat phantom," IEEE Transactions on Nuclear SCience, vol. 49, no. 3, p. 675, 2002" and "[21] B. Sharif and Y. Bresler, "Adaptive real-time cardiac MRI using PARADISE: validation by the physiologically improved neat phantom," in 4th IEEE International Symposium on Biomedical Imaging, 2007, pp. 1020-1023."

The PINCAT phantom provides a realistic model of the dynamics of the different organs in the body. We focus on a single slice of the phantom, which has the cross section of the heart and consider dynamic contrast enhanced images with a temporal resolution of one heart-beat, acquired during the diastolic phase (where motion due to cardiac pumping is minimal). The time series data consists of 70 time frames corresponding to 70 heart-beats with respiratory motion (no breath-holding).

The contrast variations due to bolus passage were modeled realistically in regions of the Right Ventricle (RV), Left Ventricle (LV) and the Left Ventricle myocardium. The PINCAT model also accounts for variability in the respiratory motion.

Figure 3:
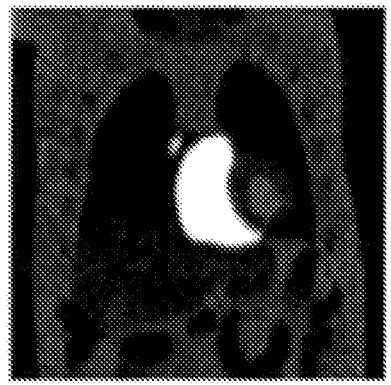
FIG. 3 illustrates the PINCAT perfusion phantom used for validation.
Figure 3:
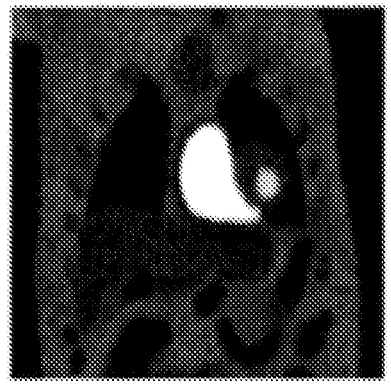
Figure 3:
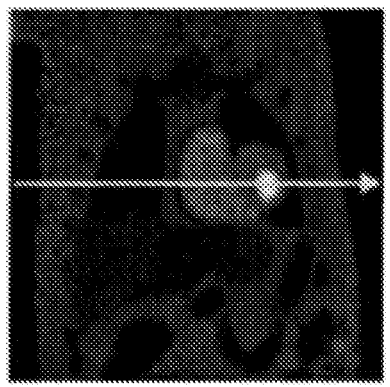
Figure 3:
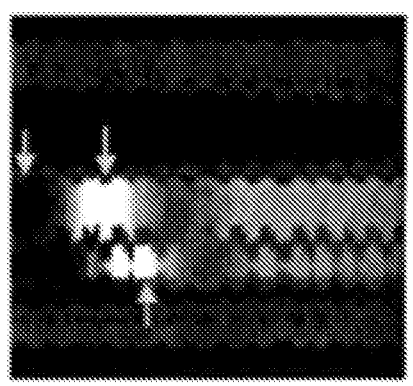

In the model considered, the predominant motion (due to respiration), is in the superior-inferior direction. The spatial matrix size is 128×128, which corresponds to a spatial resolution of 1.5×1.5 mm2. A few slices of this dataset are illustrated in FIG. 3. This figure shows the PINCAT phantom used to evaluate a herein provided method: Three distinct spatial frames at different points of the contrast uptake in (a) to (c). The image time series corresponding to the arrow in (c) is shown in (d). The locations of the frames in (a) to (c) are also marked in (d). The ripples in the Image time series correspond to the presence of respiration.

A First Experiment to Derive the Ground Truth Deformation Field D:

Before proceeding to the performance analysis of a herein provided method, a registration step is performed to derive a deformation D which could be considered as the ground truth for some of the later experiments. Two sets of fully sampled phantom data are generated: one with perfusion and motion and the other with only perfusion.

Figure 4:
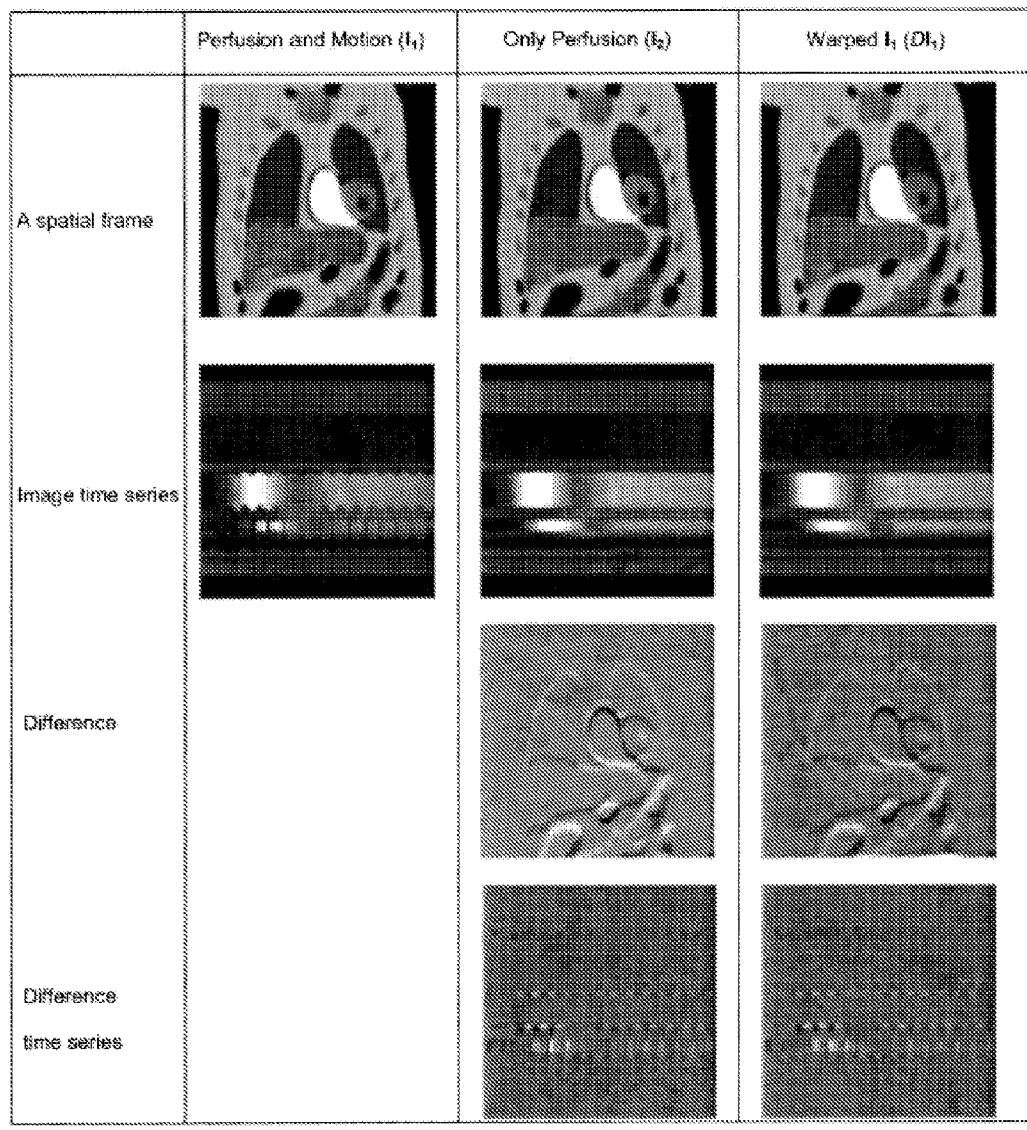
FIG. 4 shows the derivation of ground truth deformation maps based on the PINCAT phantom used for validation purposes.

Next, a frame-frame flexible registration is performed to derive D and is illustrated in FIG. 4. This figure illustrates application of the flexible deformation algorithm to derive a ground truth D. The figure shows a spatial frame and the image time series for the floating data ($I_1$-containing both perfusion and motion), reference ($I_2$ only perfusion) and the warped data ($DI_1$). To get an idea of the underlying deformation, the appropriate difference images in the last two rows are also shown. The algorithm extracts the motion accurately for most of the regions. Slight registration errors could be felt at the boundaries. The deformations estimated here are used as ground truths for later experiments.

Here, since the degree of motion is considerably large (max diaphragm movement due to breathing: 2 cm), a multi scale approach in the registration is used. The number of scale levels used is 3. The local neighborhood size of the gaussian window to calculate the cross correlation was ($\gamma$=2 pixels) and the specification of the regularizer was ($\sigma$=1, i.e a highly flexible model).

Figure 5:
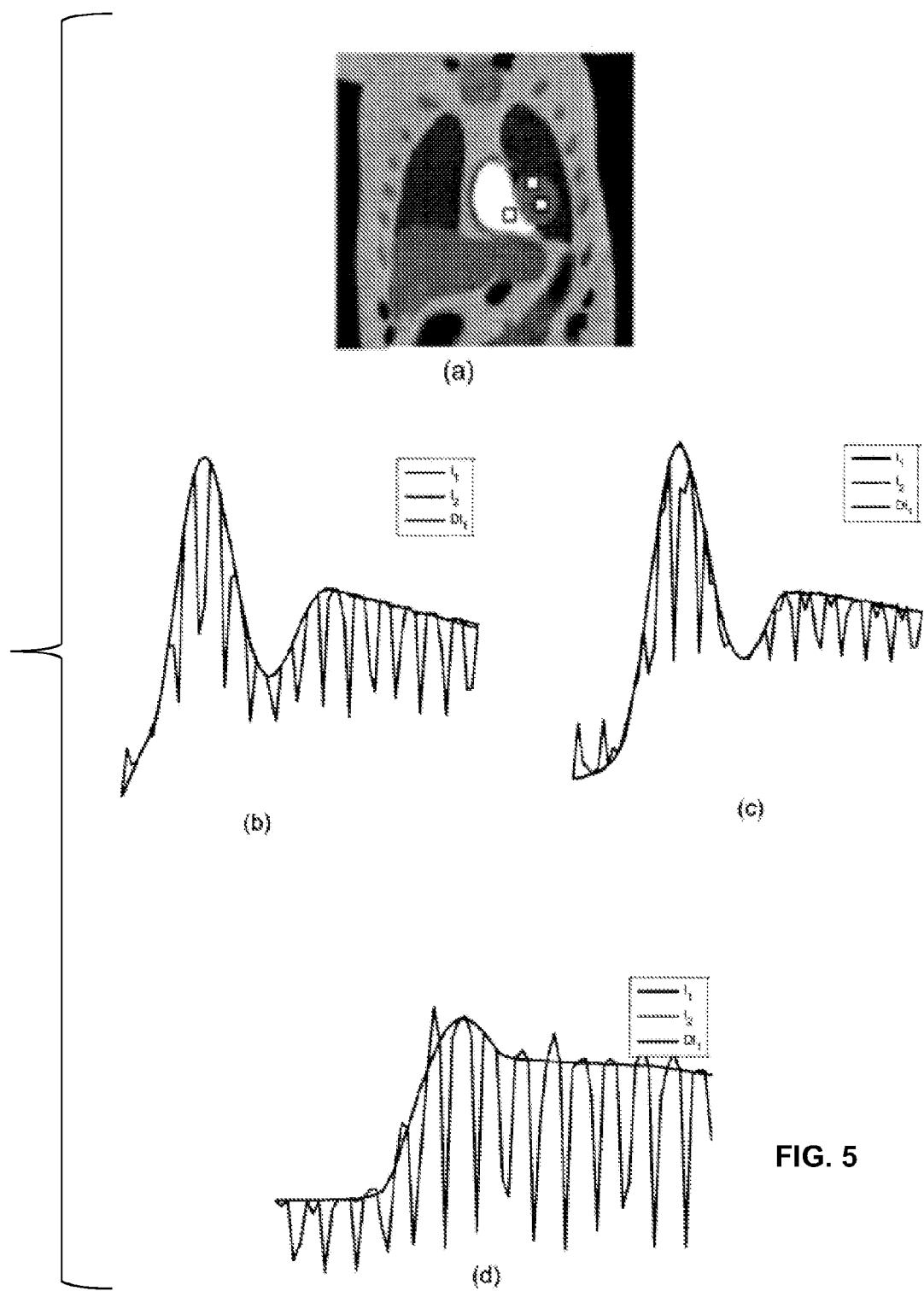
FIGS. 5 (*a*)-(*d*) illustrates typical perfusion curves in accordance with an aspect of the present invention.

FIG. 5 illustrates some sample perfusion curves before and after registration to appreciate the accuracy of the deformation algorithm. The time series of three pixels in the regions of the right ventricle, left ventricle and the left ventricle myocardium are shown respectively in (b-d). The warped time series is close to the ideal motion free time series due to the efficient motion compensation performed by the registration method. FIG. 5 (a) illustrates a spatial frame.

Performance Analysis of the First Three Sub Problems

This section is focused on the first three sub problems assuming the deformation is known. Here, the simpler individual sub problems are validated and in the later sections, the more complex deformation algorithm in the alternating frame work is discussed. The goal of the present section is to show that with a known deformation D, the first three sub problems are well posed and are guaranteed to converge. D is fixed which was derived earlier. Undersampling is performed in the k-t space using an equi-angled radial trajectory; the angular spacing between the spokes is chosen to obtain a specified acceleration factor. The trajectory is rotated by a certain angle in each temporal frame. In this experiment, 30 radial spokes/frame are used which correspond to an acceleration of 4.26.

Figure 6:
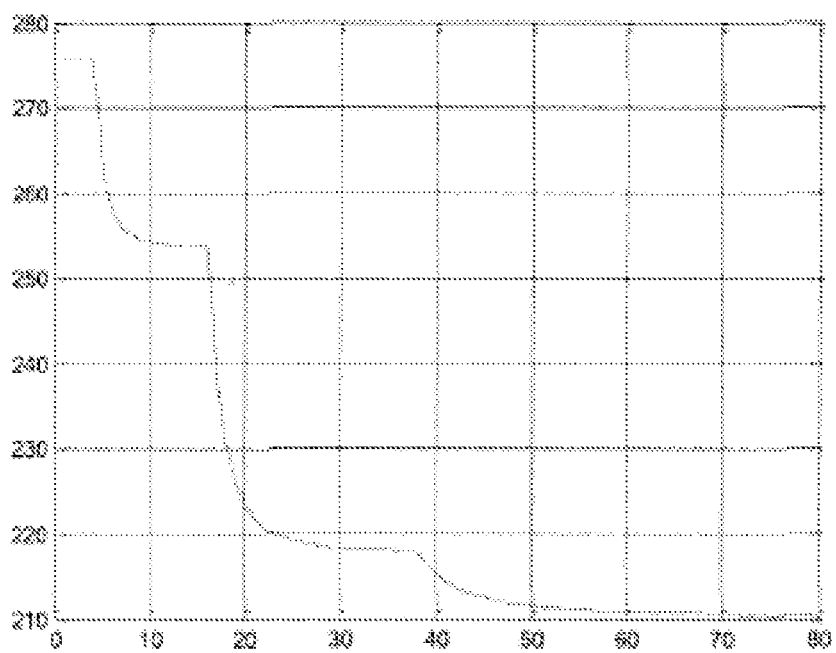
FIG. 6 illustrates a cost curve in accordance in accordance with an aspect of the present invention.

The method starts with low values of $\beta_1=10^{-3}$ and $\beta_2=10^{-3}$ and at the end of each inner loop of the method, an increment factor of 10 is used for both $\beta_1$ and $\beta_2$. The decreasing cost as the algorithm converges is plotted in FIG. 6. This figure illustrates cost v. iterations for the continuation framework involving the Fourier replacement, TV shrinkage and Low pass filtering sub problems. Here, the registration sub problem is assumed to be solved, hence D is fixed as $D_{ideal}$.

Figure 7:
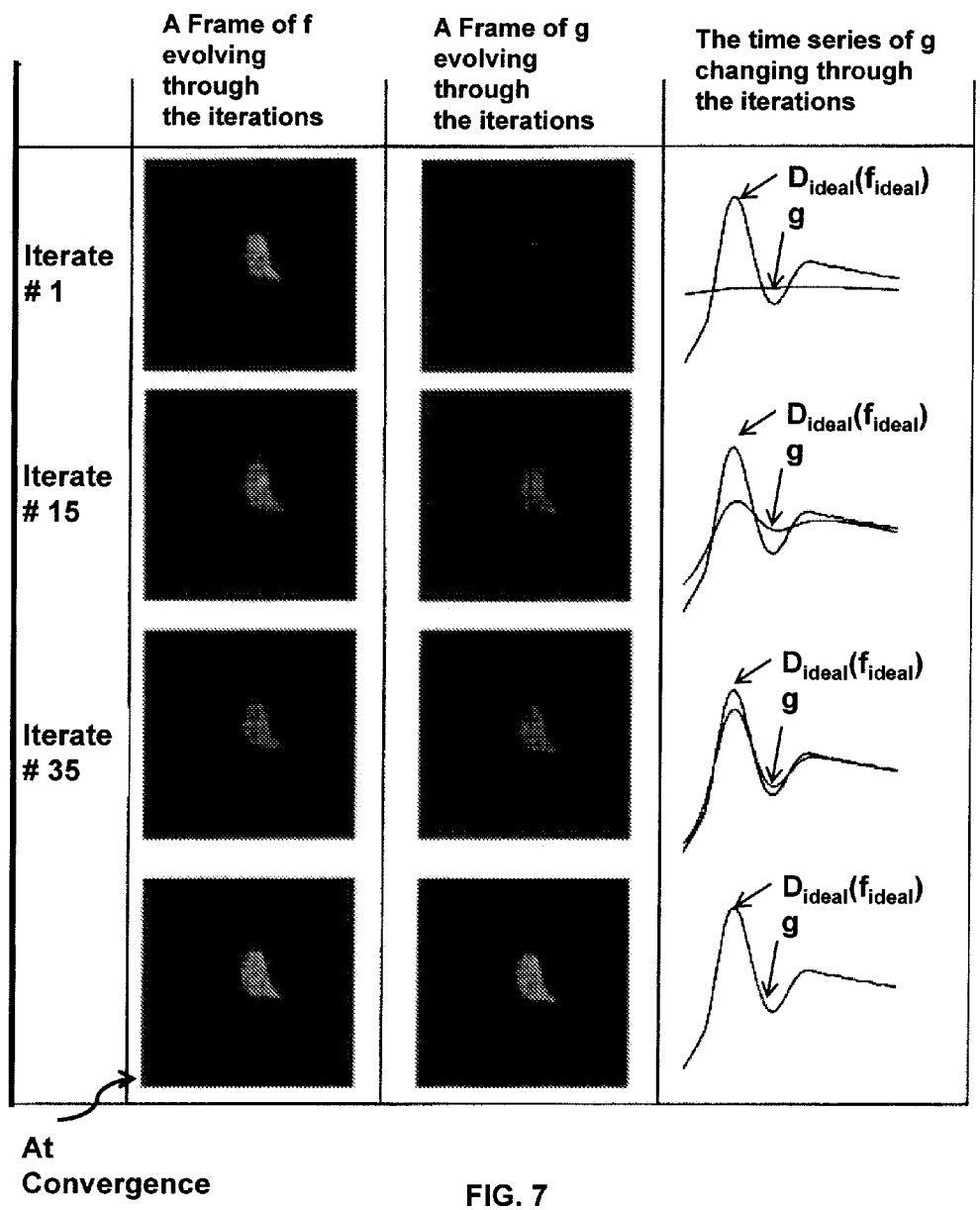
FIG. 7 illustrates an evolution of the reconstructions during iteration cycles in accordance with an aspect of the present invention.

FIG. 7 illustrates behavior of f and g through the iterations: the evolution is shown of a spatial frame for f and g and the time series of a pixel in the right ventricle of g. The 2D spatial TV regularizer's role can easily be appreciated from the first column, where the noisy streak artifacts are reduced efficiently. Note that, the tuning parameter for the TV term was chosen carefully such that the important edges and details were preserved and only the artifacts were smoothened. The last column shows that the auxiliary variable g starts with a smooth estimate of the deformed scene and adapts to a more data representative estimate as the cost converges. FIG. 7 also illustrates that as the cost converges, f becomes clean of artifacts due to the role of the TV regularizer and the auxiliary variable g tends to Df. One can see that g starts with a very smooth model of the deformed dynamic scene and learns the perfusion dynamics gradually. Sample screen shots of how f and g evolve during the iterations are also shown. This experiment clearly demonstrates that the alternating framework is well posed assuming a fixed D.

Performance Analysis of the Framework Including the Registration Sub-Problem

As discussed earlier, a frame—frame registration is provided between the dynamic scene f and the smooth dynamic scene of the deformed object in the auxiliary variable g. In the initial iterations of the framework, the floating image time series f is significantly noisy due to the radial streak artifacts. For the registration algorithm to be robust to the noise here, ideally a very rigid model (large Gaussian kernel regularizer) should be used. Subsequently, as the method converges f would be cleaner with lesser artifacts due to the role of TV regularizer and one could use the more accurate flexible model to estimate the motion. The behavior of the reference time series g as explained in the previous section would change from a smooth model along time to a more data representative one. So, the need of the hour is to tune the deformation algorithm's parameter specifications efficiently such that the motion correction during the iterations is robust to outliers (noisy artifacts) and at the same time should be close to accurate. To achieve this objective and in accordance with an aspect of the present invention the tuning of the deformation method is adapted as the iterations proceed.

Figure 8:
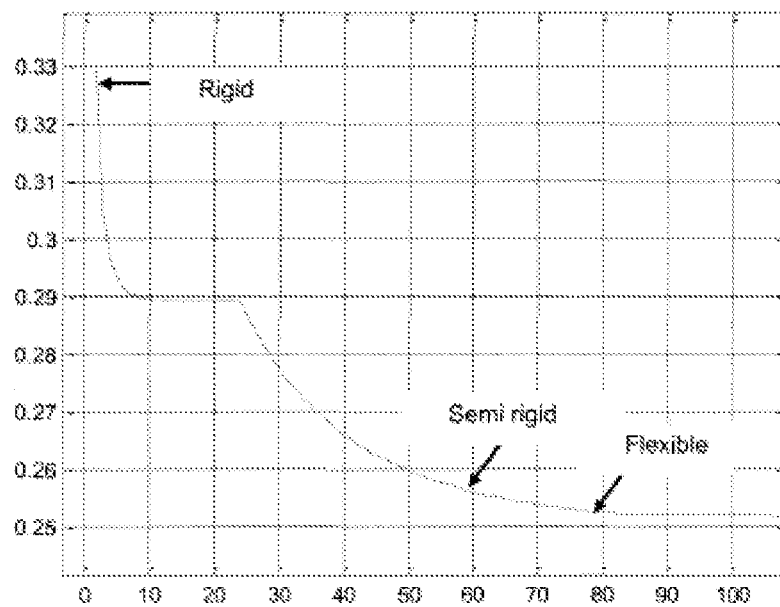
FIG. 8 illustrates another cost curve in accordance in accordance with an aspect of the present invention.

Specifically, the method starts with a highly rigid model during the first few iterations and once a reasonable estimate of D is obtained with this model, it is fixed and the rest of the sub problems are allowed to iterate. Next, the complexity of the motion estimation process is increased by using a semi rigid (or a partially flexible) model and fix the D estimated here and similar to above allow the other sub problems to proceed. This is again repeated by using a more accurate flexible model when the entire cost is close to convergence. The specification of the kernel size of the Gaussian regularizer was $\sigma=10$, $\sigma=5$, $\sigma=1$, respectively for the rigid, semi-rigid and flexible models, while the no. of scale levels and the neighborhood size ($\gamma$) for the local cross correlation calculation were 3 and 2 respectively for all the models. The cost here is illustrated in FIG. 8 which shows in a graph cost v. iterations for the continuation framework with the registration sub problem included. The points at which the different deformation models are used are also marked.

Figure 9:
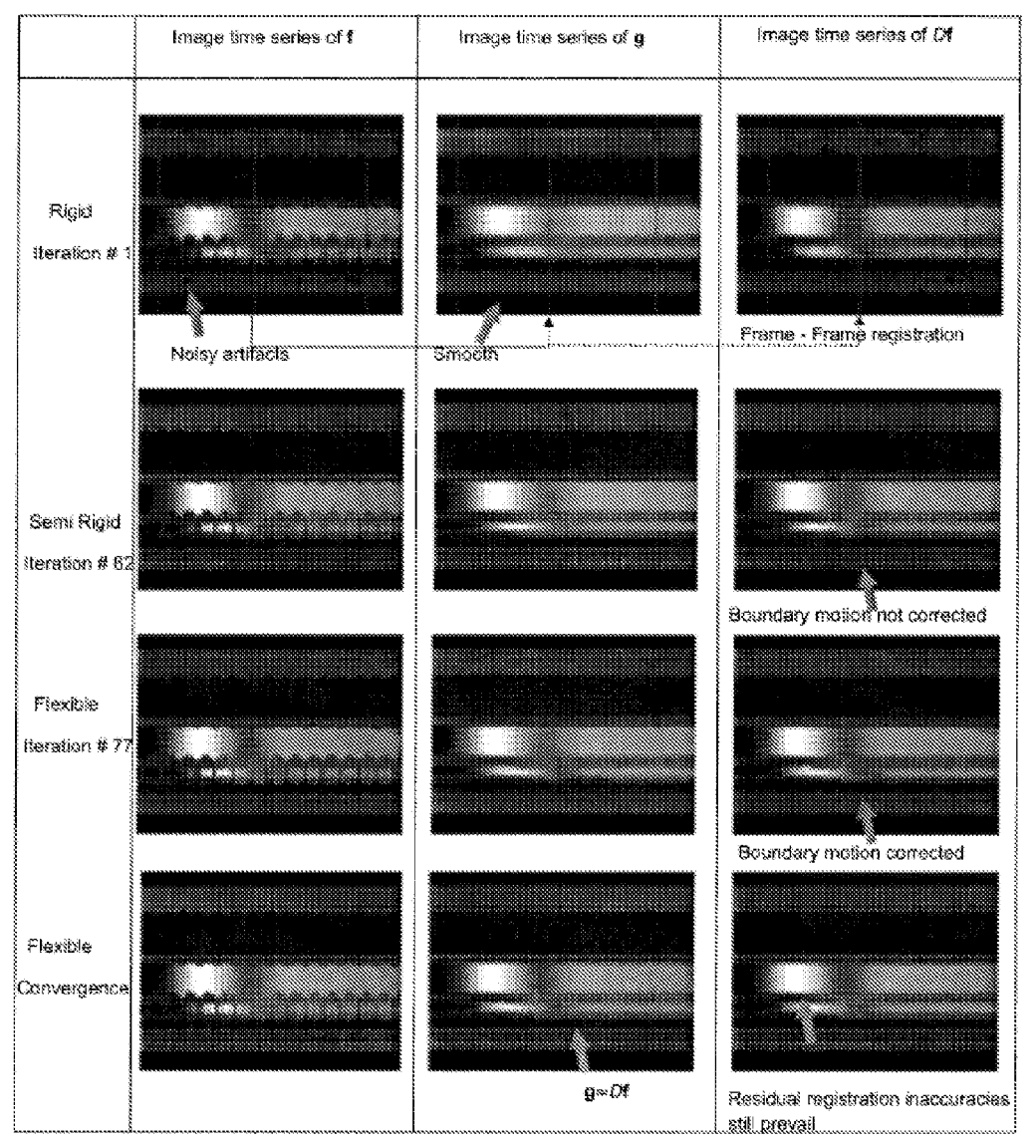

The performance of this approach is illustrated in FIG. 9. Performance evaluation of the continuation frame work with the registration sub problem included. The evolving image time series are shown of the uncorrected dynamic scene (f), the reference dynamic scene (g) and the warped dynamic scene (Df). From the first row, it can be seen that a rigid model is very robust to the noise and performs motion correction robustly. Note that at this stage, one is not looking at a highly accurate estimate of D, but is interested in obtaining a decent estimate robustly in the presence of the outliers. Next, the second row shows that the f gets cleaner and one can start to use a more accurate deformation algorithm to update D. The semi rigid model improves D considerably but has certain boundary motions uncompensated. As the method proceeds, it resorts to a more flexible model as seen in the last two rows, where D is improved considerably. At convergence, small inaccuracies still prevail due to registration errors. One can also see that at convergence the constraints in eq. (3) are met, the approximation of the constraint g==Df is shown here.

In FIG. 9, the image time series are shown as an aid to visualize the undergoing changes of the variables as opposed to an individual pixel time series which was done in the previous section. The reason behind this is that the D estimated here through the iterations is evolving and picking a particular pixel of interest and comparing it to an ideal pixel of the ground truth phantom wouldn't be feasible as one cannot guarantee that the pixels are perfectly aligned through the iterations. The specifications of the continuation parameters were: $\beta_1=10^{-1}$ and $\beta_2=10^{-3}$, with an increment factor of 5 and 20 for $\beta_1$ and $\beta_2$ respectively.

Bottleneck: Integration of the Registration Method in the Iterative Frame Work

Figure 10:
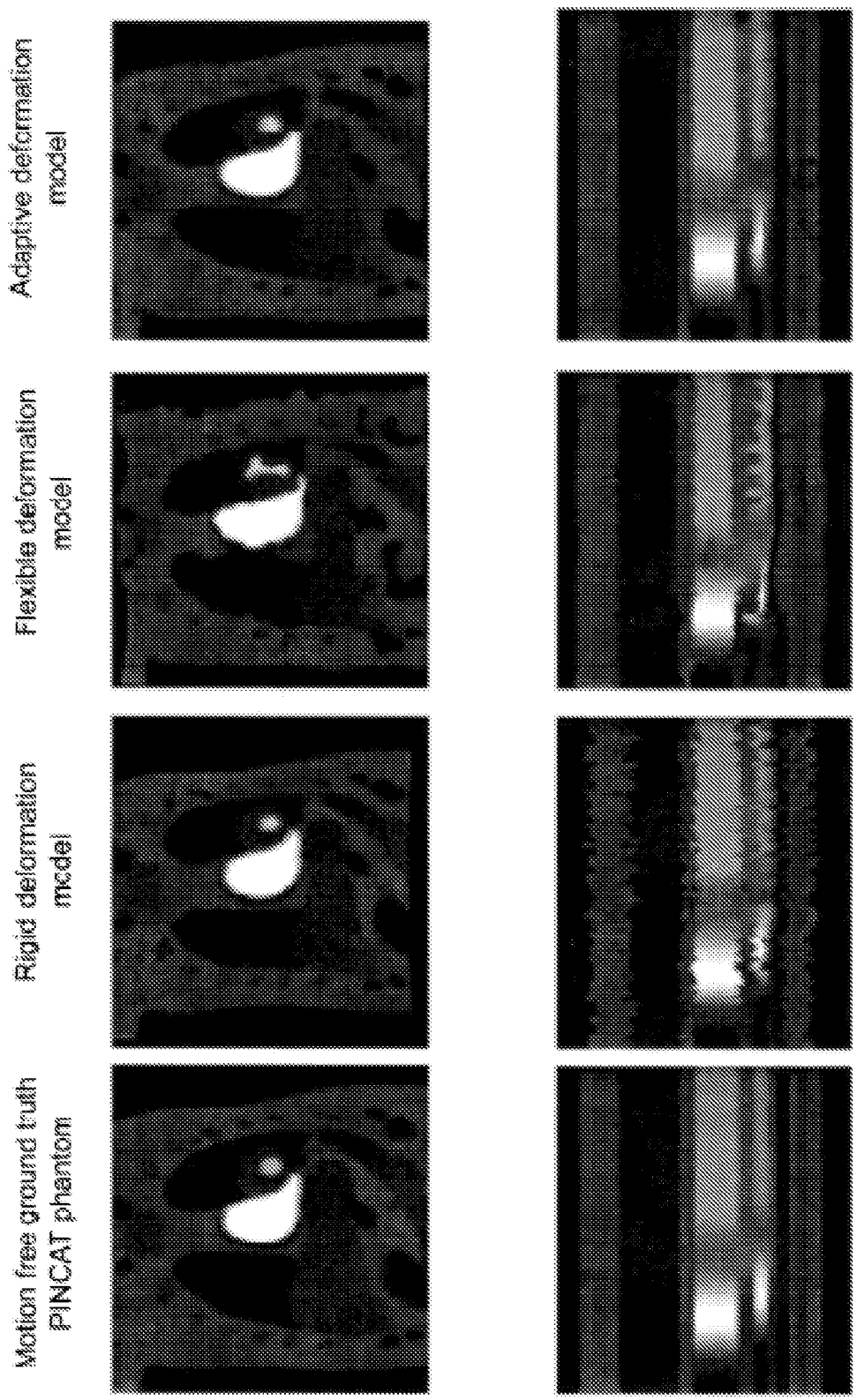
FIG. 10 illustrates an effect of using different deformation models in accordance with an aspect of the present invention.

Some experiments demonstrate the problems that one may encounter if the parameters of the registration method are not adapted as the iterations proceed. Specifically, effects of using only a rigid model, only a flexible model in comparison to the adaptive strategy that was used earlier are demonstrated. As shown in FIG. 10, the flexible model has inaccuracies because it lacked robustness in its initial stages while the rigid model although was robust to noise has inaccuracies due to incorrect estimates. These effects can be overcome, if one uses an adaptive tuning strategy.

FIG. 10 illustrates effects of different deformation models when used in the iterative frame work. A spatial frame and the image time series of the ground truth are shown and rigid, flexible and the adaptive deformation model regimes. Clearly the practical problem of adaptive tuning of the registration sub-problem parameters will be appreciated from the second and third columns. This is dealt by calling the highly non linear registration algorithm only a few number of times allowing the user to incorporate meaningful specifications at specific iterations, which significantly improves the performance of the iterative framework as seen in the last column.

Figure 11:
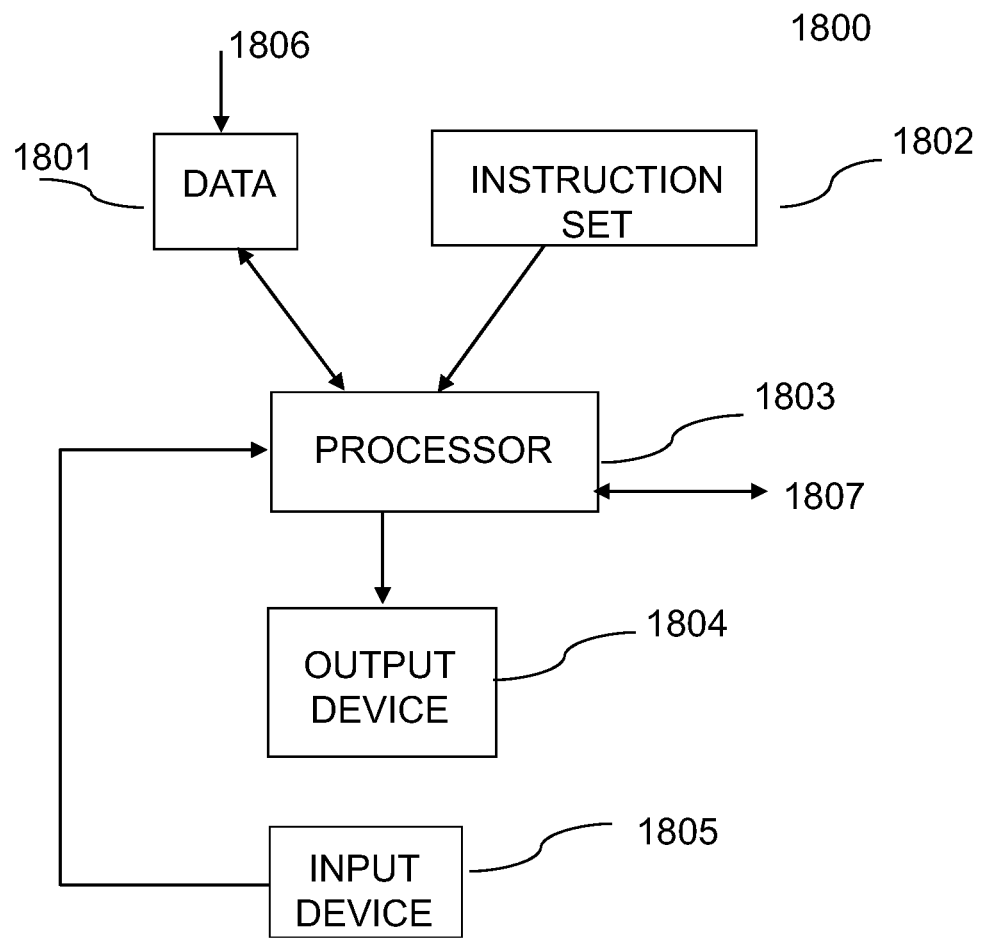
FIGS. 11 and 12 each illustrate a system in accordance with an aspect of the present invention.

A system 1800 illustrated in FIG. 11 and as provided herein in accordance with an aspect of the present invention is enabled for receiving, processing and generating data to perform the steps of the methods as provided herein in accordance with various aspects of the present invention. The system 1800 is provided with data that can be stored on a memory 1801. Data such as image data may be obtained from a data source such as an imaging machine, for instance via an input 1806. Such data may be medical data or any other image data. The system has a processor 1803. The processor 1803 is provided or programmed with an instruction set or program executing the methods of the present invention that is stored on a memory 1802 and is provided to the processor 1803, which executes the instructions of 1802 to process the data from 1801. Data, such as registered image data or perfusion image data or any other signal resulting from the processor can be outputted on an output device 1804, which may be a display to display image data or it may be a data storage device. Device 1804 may also be a communication device that is for instance connected to a network.

The processor also has a communication channel 1807 to receive external data from a communication device and to transmit data to an external device. The system in one embodiment of the present invention has one or more input devices 1805, which may be a keyboard, a mouse or any other device that can generated data to be provided to processor 1803 and that allows a user to interact with the processor, for instance based on a request for input. The processor can be dedicated hardware. However, the processor can also be a CPU or any other computing device that can execute the instructions of 1802. Accordingly, the system as illustrated in FIG. 11 provides a system 1800 for processing data resulting from an MRI machine or any other data source and is enabled to execute the steps of the methods as provided herein as an aspect of the present invention.

Figure 12:
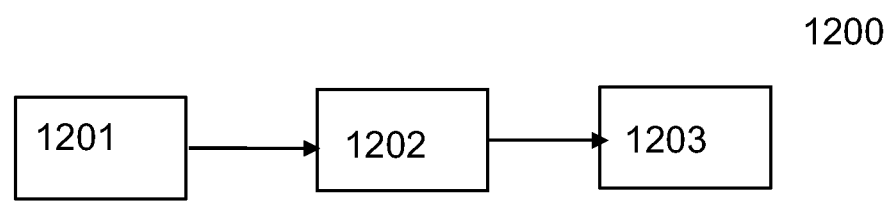

FIG. 12 is another illustration of a system 1200 in accordance with an aspect of the present invention. MRI first pass perfusion data is received by a processor based computer system 1202 from a source 1201, which may be an MRI machine. The processor based computer system 1202 performs steps as provided above as an aspect of the present invention on data received from 1201 and outputs data representing a motion compensated or motion corrected perfusion image. Such image data may be provided to a display 1203 to be displayed as an image. In a further embodiment of the present invention the system and methods as provided herein are performed in a medical facility, such as a hospital or a medical clinic or a medical practice. In a further embodiment of the present invention the data provided by methods and/or system that are an aspect of the present invention are used by a medical worker, by a radiologist, by a cardiologist or by anyone else that analyzes cardiac perfusion data. The data may be reviewed as an image or it may be used by a person or a machine for quantitative analysis.

A novel framework including methods and a system to unify reconstruction and motion estimation steps in first pass cardiac perfusion MRI have been provided in accordance with various aspects of the present invention. The unifying framework had a global objective function that meets data consistency, spatial smoothness, motion and contrast dynamics constraints. The global objective was solved by a variable splitting strategy with continuation, where the complex cost was decomposed into simpler sub problems. Sub-problems and solutions have been created that take well defined forms: low pass filtering of the deformed object, TV shrinkage, analytical Fourier replacement and an $L_2$ minimizing problem that can be dealt with a standard registration tool. A registration tool based on the local cross-correlation similarity measure, which has the capability to perform both rigid and flexile deformations, is applied. The practical problem of tuning the registration parameters is addressed by using a rigid, semi rigid and a flexible model at different stages of the iterations. Experiments and initial findings on the PINCAT phantom data demonstrate the usefulness of the herein provided methods.

The following references provide background information generally related to the present invention and are hereby incorporated by reference: [1] J. Mines, R J. van der Geest, M. Jerosch-Herold, J. H. C. Reiber, and B. P. F. Lelieveldt, "Fully automated motion correction in first-pass myocardial perfusion MR image sequences," *IEEE Transactions on Medical Imaging*, vol. 27, no. 11, pp. 1611-1621, 2008; [2] R Bansal and G. Funka-Lea, "Integrated image registration for cardiac MR perfusion data," in *Proc. MICCAI*, 2002, pp. 659-666; [3] G. Z. Yang, P. Burger, J. Panting, P. D. Gatehouse, D. Rueckert, D. J. Pennell, and D. N. Firmin, "Motion and deformation tracking for shortaxis echo-planar myocardial perfusion imaging," *Med. Image Anal.*, vol. 2, pp. 285-302, 1998; [4] G. Adluru, E. V. R DiBella, and M. R Schabel, "Model-based registration for dynamic cardiac perfusion MRI," *Magn. Reson. Med.*, vol. 24, pp. 1062-1070, 2006; [5] J. Tsao, P. Boesiger, and K. Pruessmann, "kt BLAST and kt SENSE: dynamic MRI with high frame rate exploiting spatiotemporal correlations," Magnetic Resonance in Medicine, vol. 50, no. 5, pp. 1031-1042, 2003; [6] H. Jung, J. Park, J. Yoo, and J. C. Ye, "Radial k-t FOCUSS for high-resolution cardiac cine MRI," Magnetic Resonance in Medicine, October 2009; [7] Jeffrey A Fessler, "Optimization Transfer Approach to Joint Registration Reconstruction for Motion compensated Image reconstruction", in the proceedings of ISBI2010; [8] H. Jung, and J. C. Ye, "Motion Estimated and Compensated Compressed Sensing Dynamic Magnetic Resonance Imaging: What We Can Learn From Video Compression Techniques, "*International Journal of Imaging Systems and Technology*. vol 20, pp. 81-98, 18 May 2010; [9] Pedersen, H., Olafsdottir, H., Larsen, R, and Larsson, A unifying model of perfusion and motion applied to reconstruction of sparsely sampled free-breathing myocardial perfusion MRI. In *Proceedings of the 2010 IEEE international Conference on Biomedical Imaging: From Nano To Macro* (Rotterdam, Netherlands, Apr. 14-17, 2010); [10] H. Pedersen and H. B. W. Larsson and R Larsen, "Reconstruction of free-breathing myocardial perfusion MRI using simultanous modeling of perfusion and motion (SMPM) and arbitrary k-space sampling", in proceedings of ISMRM 2009; [11] Chapter 19 in Richard Phillips Feynman, Robert B Leighton, Matthew Sands, "Feynman's lectures on Physics (Volume 2)", Pearson Publishers; [12] Lecture notes of B. Russak, "CALCULUS OF VARIATIONS MA 4311 LECTURE NOTES" URLhttp://www.math.nps.navy.mill-bneta14311.pdf; [13] J. Yang, W. Yin, Y. Zhang, and Y. Wang, *A fast algorithm for edge-preserving variational multichannel image restoration*, Tech. Report 08-09, CAAM, Rice University. Submitted; [14] J. Yang, Y. Zhang, and W. Yin, "A fast TVL 1-L2 minimization algorithm for signal reconstruction from partial Fourier data," IEEE J. of Selected Topics Signal Processing, vol. 4, pp. 288-297, 2009; [15] Chefd'hotel, C., Hermosillo, G., and Faugeras, 0.2001. A variational approach to multimodal image matching. In *IEEE Workshop on Variational and Level Set Methods*, University of British Columbia, Vancouver, Canada. IEEE Computer Society, pp. 21-28; [16] Chefd'hotel, C., Hermosillo, G., Faugeras, 0.: Flows of diffeomorphisms for multimodal image registration. In: Proc. ISBI'02. (2002) 753-756; [17] G. Hermosillo, C. Chefd'hotel, and O. Faugeras, *Variational methods for multimodal image matching*, International Journal of Computer Vision 50 (2002), no. 3, 329-343; [18] Chefd'hotel Christophe, "Geometric Methods in Computer Vision and Image Processing: Contributions and Applications", *Ph.d thesis*, April 2005; [19] J. Yang and Y. Zhang, "Alternating direction algorithms for 11-problems in compressive sensing," preprint, 2009; [20] W. Segars and B. Tsui, "Study of the efficacy of respiratory gating in myocardial SPECT using the new 4-d ncat phantom," IEEE Transactions on Nuclear SCience, vol. 49, no. 3, p. 675, 2002; [21] B. Sharif and Y. Bresler, "Adaptive real-time cardiac MRI using PARADISE: validation by the physiologically improved ncat phantom," in 4th IEEE International Symposium on Biomedical Imaging, 2007, pp. 1020-1023; [22] G. Adluru, S. Awate, T. Tasdizen, R. Whitaker, and E. DiBella, "Temporally constrained reconstruction of dynamic cardiac perfusion MRI," Magnetic Resonance in Medicine, vol. 57, no. 6, pp. 1027-1036, 2007; [23] G. Adluru, R. Whitaker, and E. DiBella, "Spatio-temporal constrained reconstruction of sparse dynamic contrast enhanced radial MRI data," in 4th IEEE International Symposium on Biomedical Imaging, 2007, pp. 109-11.

While there have been shown, described and pointed out fundamental novel features of the invention as applied to preferred embodiments thereof, it will be understood that various omissions and substitutions and changes in the form and details of the methods and systems illustrated and in its operation may be made by those skilled in the art without departing from the spirit of the invention. It is the intention, therefore, to be limited only as indicated by the scope of the claims.

The invention claimed is:

1. A method for processing perfusion images to correct motion effects, comprising:

a processor receiving undersampled image data of a dynamic scene of a first-pass cardiac perfusion MRI;

the processor minimizing a single objective function that combines at least three terms, each term depending on image data representing a true dynamic scene, wherein a first term expresses a motion estimation related to the undersampled image data, a second term expresses a temporal constraint and a third term expresses a spatial constraint;

the processor minimizing the objective function by constraining the temporal constraint term and the spatial constraint term and applying a penalizing term that penalizes a violation of the constraining; and the processor generating data representing a reconstructed perfusion image corrected for motion based on the minimized single objective function.

2. The method of claim 1, wherein the objective function is expressed as:

$$|Af-b|_2^2+\gamma|(Df)_t|_2^2+\mu|Tf|,$$

wherein
f is a vector representing the true dynamic scene related to the undersampled image data,
A is an operator specifying an undersampling Fourier task,
b is a vector representing the undersampled image data,
D is a deformation operator,
T is a spatial total variation operator,
$(.)_t$ is a first order temporal derivative operator,
γ a regularization factor, and
μ is a tuning parameter.

3. The method of claim 1, wherein the constrained objective function is expressed as:

$$|Af-b|_2^2 + \lambda|g_t|_2^2 + \frac{\beta_1}{2}|Df-g|_2^2 + \mu|w| + \frac{\beta_2}{2}|Tf-w|_2^2,$$

with Df=g and Tf=w,
wherein:
f is a vector representing the true dynamic scene related to the undersampled image data,
A is an operator specifying an undersampling Fourier task,
b is a vector representing the undersampled image data,
D is a deformation operator,
T is a spatial total variation operator,
$(.)_t$ is a first order temporal derivative operator,
γ a regularization factor,
μ is a tuning parameter,
g and w are auxiliary variables, and
$\beta_1$ and $\beta_2$ are penalty parameters.

4. The method of claim 3, wherein the constrained objective function is minimized by the processor for the four variables f, D, g and w.

5. The method of claim 4, wherein the constrained objective function is minimized iteratively by alternately solving one of the four variables while keeping three other variables fixed.

6. The method of claim 5, wherein f, D and w are fixed and g is solved in a temporal Fourier domain by a numerical implementation of a low-pass filter.

7. The method of claim 5, wherein w is solved by applying a shrinkage operator.

8. The method of claim 5, wherein f is solved analytically in a Fourier domain.

9. The method of claim 5, further comprising:
solving the four variables for a first value of $\beta_1$ and $\beta_2$ until a stopping criterion is met;
incrementing $\beta_1$ and $\beta_2$ to a second value; and
solving the four variables for the second value of $\beta_1$ and $\beta_2$.

10. The method of claim 3, wherein $\beta_1$ and $\beta_2$ are increased in value followed by solving the four variables until the constraints Df=g and Tf=w are met.

11. The method of claim 3, wherein the reconstructed perfusion image corrected for motion based on the minimized single objective function is determined by Df.

12. A system to process perfusion images to correct motion effects, comprising:
a memory, enabled to store data:
a processor, enabled to execute instructions to perform the steps:
receiving undersampled image data of a dynamic scene of a first-pass cardiac perfusion MRI;
minimizing a single objective function that combines at least three terms, each term depending on image data representing a true dynamic scene, wherein a first term expresses a motion estimation related to the undersampled image data, a second term expresses a temporal constraint and a third term expresses a spatial constraint and minimizing the objective function by constraining the temporal constraint term and the spatial constraint term and applying a penalizing term that penalizes a violation of the constraining; and
generating data representing a reconstructed perfusion image corrected for motion based on the minimized single objective function.

13. The system of claim 12, wherein the objective function is expressed as:

$$|Af-b|_2^2+\gamma|(Df)_t|_2^2+\mu|Tf|,$$

wherein
f is a vector representing the true dynamic scene related to the undersampled image data,
A is an operator specifying an undersampling Fourier task,
b is a vector representing the undersampled image data,
D is a deformation operator,
T is a spatial total variation operator,
$(.)_t$ is a first order temporal derivative operator,
γ a regularization factor, and
μ is a tuning parameter.

14. The system of claim 12, wherein the constrained objective function is expressed as:

$$|Af-b|_2^2 + \lambda|g_t|_2^2 + \frac{\beta_1}{2}|Df-g|_2^2 + \mu|w| + \frac{\beta_2}{2}|Tf-w|_2^2,$$

with Df=g and Tf=w,
wherein:
f is a vector representing the reconstructed image data representing the dynamic scene related to the undersampled image data,
A is an operator specifying an undersampling Fourier task,
b is a vector representing the undersampled image data,
D is the deformation operator,
T is a spatial total variation operator,
$(.)_t$ is a first order temporal derivative operator,
γ a regularization factor,
μ is a tuning parameter,
g and w are auxiliary variables, and
$\beta_1$ and $\beta_2$ are penalty parameters.

15. The system of claim 14, wherein the constrained objective function is minimized by the processor for the four variables f, D, g and w.

16. The system of claim 15, wherein the constrained objective function is minimized iteratively by alternately solving one of the four variables while keeping three other variables fixed.

17. The system of claim 16, wherein f, D and w are fixed and g is solved in a temporal Fourier domain by a numerical implementation of a low-pass filter.

18. The system of claim 16, wherein w is solved by applying a shrinkage operator.

19. A method for processing perfusion images to correct motion effects, comprising:
a processor receiving undersampled image data of a dynamic scene of a first-pass cardiac perfusion MRI;
the processor minimizing a single objective function that combines at least three terms, each term depending on image data representing a true dynamic scene, wherein a first term expresses a motion estimation related to the undersampled image data, a second term expresses a temporal constraint and a third term expresses a spatial constraint; and the processor generating data representing a reconstructed perfusion image corrected for motion based on the minimized single objective function, wherein the objective function is expressed as:

$$|Af-b|_2^2 + \gamma|(Df)_t|_2^2 + \mu|Tf|,$$

wherein f is a vector representing the true dynamic scene related to the undersampled image data, A is an operator specifying an undersampling Fourier task, b is a vector representing the undersampled image data, D is a deformation operator, T is a spatial total variation operator, $(.)_t$ is a first order temporal derivative operator, γ a regularization factor, and μ is a tuning parameter.

* * * * *